United States Patent
Darwish et al.

(10) Patent No.: US 10,283,691 B2
(45) Date of Patent: May 7, 2019

(54) NANO-COMPOSITE THERMO-ELECTRIC ENERGY CONVERTER AND FABRICATION METHOD THEREOF

(71) Applicant: Dillard University, New Orleans, LA (US)

(72) Inventors: Abdalla Darwish, Kenner, LA (US); Sergey Sarkisov, Huntsville, AL (US); Paolo Mele, Muroran (JP)

(73) Assignee: Dillard University, New Orleans, LA (US)

( * ) Notice: Subject to any disclaimer, the term of this patent is extended or adjusted under 35 U.S.C. 154(b) by 0 days.

(21) Appl. No.: 14/853,674

(22) Filed: Sep. 14, 2015

(65) Prior Publication Data

US 2016/0056361 A1 Feb. 25, 2016

Related U.S. Application Data

(63) Continuation-in-part of application No. 14/506,685, filed on Oct. 5, 2014, which is a continuation-in-part (Continued)

(51) Int. Cl.
*H01L 35/22* (2006.01)
*H01L 35/34* (2006.01)
*H01L 35/02* (2006.01)

(52) U.S. Cl.
CPC .............. *H01L 35/22* (2013.01); *H01L 35/02* (2013.01); *H01L 35/34* (2013.01)

(58) Field of Classification Search
CPC .................................................... C23C 14/28
See application file for complete search history.

(56) References Cited

U.S. PATENT DOCUMENTS

| 5,192,580 A | 3/1993 | Blanchet-Fincher | 427/596 |
| 5,246,885 A | 9/1993 | Braren | 257/E21.546 |

(Continued)

FOREIGN PATENT DOCUMENTS

| JP | 2006117986 A | 5/2006 |
| KR | 100745619 B1 | 7/2007 |

(Continued)

OTHER PUBLICATIONS

App Surf Sci Schlenkrich V257 2011 p. 5362-5365.*

(Continued)

*Primary Examiner* — Joseph A Miller, Jr.
(74) *Attorney, Agent, or Firm* — James Richards

(57) ABSTRACT

Briefly, the present disclosure relates to a nanocomposite thermoelectric energy converter comprising a composite thin film inorganic semiconductor having carbonized polymer nano-clusters and the net of polymer nano-fibers included within. The carbonized polymer nano-clusters and nano-fibers improve the thermoelectric figure of merit ZT by increasing electrical conductivity and decreasing thermal conductivity. The converter may be fabricated by a dual beam pulsed laser deposition process. A first laser beam evaporates a target comprising the materials of the inorganic semiconductor. A second laser beam evaporates the polymer using a matrix assisted target for depositing the polymer concurrently with the semiconductor deposition to yield the composite film. The lasers may be separately controlled to determine the resulting composition. The converter may be deposited on rigid or flexible substrates for a wide range of applications.

18 Claims, 12 Drawing Sheets

Related U.S. Application Data of application No. 14/158,567, filed on Jan. 17, 2014, now abandoned.

(60) Provisional application No. 62/071,117, filed on Sep. 15, 2014, provisional application No. 61/850,330, filed on Feb. 14, 2013.

(56) References Cited

U.S. PATENT DOCUMENTS

| | | | |
|---|---|---|---|
| 5,288,336 A | 2/1994 | Strachan et al. | 136/200 |
| 5,304,406 A | 4/1994 | Hongo | 427/554 |
| 5,490,912 A | 1/1996 | Warner et al. | 204/298.02 |
| 5,535,128 A | 7/1996 | Laube et al. | 564/468.12 |
| 5,558,788 A | 9/1996 | Mashburn | 219/121.68 |
| 5,612,887 A | 3/1997 | Laube et al. | 364/468.12 |
| 5,660,746 A | 8/1997 | Witanachchi | 219/121.68 |
| 5,711,810 A | 1/1998 | Sengupta | 118/722 |
| 5,747,120 A | 5/1998 | McLean, II et al. | 427/596 |
| 5,760,366 A | 6/1998 | Haruta | 219/121.68 |
| 5,820,682 A | 10/1998 | Sung | 118/726 |
| 5,849,371 A | 12/1998 | Beesley | 427/566 |
| 6,025,036 A | 2/2000 | McGill | 427/492 |
| 6,037,313 A | 3/2000 | Nagaishi et al. | 505/474 |
| 6,388,185 B1* | 5/2002 | Fleurial | H01L 35/16 136/203 |
| 6,491,795 B2 | 12/2002 | Christen et al. | 118/722 |
| 6,509,070 B1 | 1/2003 | Voevodin et al. | 427/572 |
| 6,534,784 B2 | 3/2003 | Eliasson et al. | 257/25 |
| 6,605,772 B2 | 8/2003 | Harman et al. | |
| 6,632,539 B1 | 10/2003 | Iijima | 427/62 |
| 6,998,156 B2 | 2/2006 | Bubb et al. | 427/596 |
| 7,179,986 B2 | 2/2007 | Harman et al. | |
| 7,488,888 B2 | 2/2009 | Mitchell et al. | 136/200 |
| 7,501,145 B2 | 3/2009 | Selvamanickam | 427/62 |
| 7,544,398 B1 | 6/2009 | Chang et al. | 427/537 |
| 7,660,042 B2 | 2/2010 | Sasaki et al. | 359/626 |
| 7,661,387 B2 | 2/2010 | Poullos | 118/667 |
| 7,687,705 B2 | 3/2010 | Ila | 136/224 |
| 7,834,263 B2 | 11/2010 | DeSteese et al. | 136/205 |
| 7,977,602 B2 | 7/2011 | Birrell | 219/121.69 |
| 8,310,134 B2 | 11/2012 | Ajayan et al. | 310/357 |
| 8,841,539 B2 | 9/2014 | Ila | 136/203 |
| 2002/0081397 A1 | 6/2002 | McGill | 427/596 |
| 2003/0121887 A1* | 7/2003 | Garvey | B82Y 30/00 216/65 |
| 2004/0031515 A1* | 2/2004 | Sadatomi | H01L 35/22 136/239 |
| 2004/0040506 A1 | 3/2004 | Ovshinsky et al. | 118/718 |
| 2004/0214362 A1 | 10/2004 | Hill | 438/33 |
| 2004/0250769 A1 | 12/2004 | Freeman | 118/718 |
| 2007/0243328 A1 | 10/2007 | Liu | 427/255.33 |
| 2008/0254235 A1 | 10/2008 | Kim | 427/596 |
| 2009/0042314 A1 | 2/2009 | Capobianco | 436/501 |
| 2009/0290614 A1 | 11/2009 | Gregory et al. | 374/29 |
| 2009/0311513 A1 | 12/2009 | Hu et al. | 428/323 |
| 2010/0227133 A1 | 9/2010 | Liu | |
| 2011/0111131 A1 | 5/2011 | Vergohl et al. | 427/523 |
| 2011/0194106 A1 | 8/2011 | Murkami | 356/301 |
| 2011/0247669 A1* | 10/2011 | Gerrard | H01L 35/32 136/205 |
| 2012/0055554 A1 | 3/2012 | Radu | 136/264 |
| 2012/0138870 A1 | 6/2012 | Snyder et al. | 252/513 |
| 2012/0152297 A1 | 6/2012 | Mitchell et al. | 136/205 |
| 2012/0153240 A1 | 6/2012 | Luo et al. | 252/519.4 |
| 2012/0291425 A1 | 11/2012 | Mitchell et al. | 60/320 |
| 2013/0022811 A1 | 1/2013 | Ahn | 428/336 |
| 2014/0021576 A1 | 1/2014 | Xu et al. | 257/467 |
| 2014/0068932 A1 | 3/2014 | Sturchen | 29/832 |
| 2014/0227461 A1 | 8/2014 | Darwish | 427/596 |
| 2015/0020861 A1 | 1/2015 | Ila | 136/203 |
| 2015/0187814 A1 | 7/2015 | Miyiri | 257/43 |

FOREIGN PATENT DOCUMENTS

| | | |
|---|---|---|
| WO | WO2010112956 A1 | 4/2009 |
| WO | WO2010017555 A1 | 8/2009 |
| WO | WO2013119298 A2 | 11/2012 |
| WO | WO2013155181 A1 | 4/2013 |

OTHER PUBLICATIONS

App Phys A Roeder V93 2008 p. 863-867.*

Al Mercado, C.E. Allmond, J.G. Hoekstra, J.M. Fitz-Gerald, "Pulsed laser deposition vs. matrix assisted pulsed laser evaporation for growth of biodegradable polymer thin films", Applied Physics A. 81, 591-599(2005) Springer-Verlag Sep. 30, 2004.

G.B. Blancet and C.R. Fincher, Jr. laser induced unzipping: A thermal route to polymer ablation, Appl. Phys. Lett. vol. 65, No. 10, 12994 1311-1313.

N. Morita, Y. Shimotsuma, M. Nishi, M. Sakakura, K. Miura, and K. Hirao, Direct micro-carbonization inside polymer using focused femtosecond laser pulses, Appl. Phys. Lett. vol. 105, 2014, Apr. 2011, 4 pages.

N. Molenda, M. Swietoslawski, M. Drozdek, B. Dudek, and R. Dziembaj, Morphology and electric conductivity of carbon nanocoatings prepared from pyrolized polymers, J. of Nanomaterials vol 2014, Article ID 103418, 7 pages.

Andor; "Pulsed Laser Deposition"; Web Document downloaded Oct. 7, 2014.

Christen, Hans, "Pulsed Laser Deposition of Yba2Cu3O7-d for Coated Conductor Applications: Current Status and Cost Issues"; Oak Ridge National Laboratory, Web Document downloaded Oct. 7, 2014.

Nakamoto, Go et al. "Thermoelectric properties of $Zn_{13-x}Sb_{10}$ compounds at low temperatures" Journal of Alloys and Compounds, vol. 437, Issues 1-2, Sep. 25, 2006, pp. 151-156.

Ramesh Chandra Mallik, Jae-Yong Jung, V. Damodara Das, Soon-Chul Ur and Il-Ho Kim "Thermoelectric properties of $Sn_zCo_8Sb_{24}$ skutterudites" Solid State Communications, vol. 141, Issue 4, Nov. 7, 2006, pp. 233-237.

J.L. Mi, X.B. Zhao, T.J. Zhu and J. Ma "Thermoelectric properties of skutterudites $Fe_xNi_yCo_{1-x-y}Sb_3$ (x=y)" Journal of Alloys and Compounds, Dec. 4, 2006, 5 pages.

Shigeru Katsuyama, Ryosuke Matsuo and Mikio Ito "Thermoelectric properties of half-Heusler alloys $Zr_{1-x}Y_xNiSn_{1-y}Sb_y$" Journal of Alloys and Compounds, vol. 428, Issues 1-2, 15 May 2006, pp. 262-267.

H.J. Liu, Ch.M. Song, S.T. Wu and L.F. Li "Processing method dependency of thermoelectric properties of $Bi_{85}Sb_{15}$ alloys in low temperature" ,Cryogenics, vol. 47, Issue 1, Jan. 2007, pp. 56-60.

Taek-Soo Kim and Byong-Sun Chun "Microstructure and thermoelectric properties of n- and p-type $Bi_2Te_3$ alloys by rapid solidification processes" Journal of Alloys and Compounds, vol. 437, Issues 1-2, 28 Nov. 9, 2006, pp. 225-230.

M. Takashiri, T. Shirakawa, K. Miyazaki and H. Tsukamoto, "Fabrication and characterization of $Bi_{0.4}Te_{3.0}Sb_{1.6}$ thin films by flash evaporation method," Journal of Alloys and Compounds, vol. 441, Issues 1-2, Nov. 13, 2006, pp. 246-250.

Jiangying Peng, et al. "Effect of Fe substitution on the thermoelectric transport properties of $CoSb_3$-based Skutterudite compound," Journal of Alloys and Compounds, vol. 426, Issues 1-2, Mar. 10, 2006, pp. 7-11.

E. Alleno, D. Bérardan, C. Godart, M. Puyet, B. Lenoir, R. Lackner, E. Bauer, L. Girard and D. Ravot Double filling in skutterudites: A promising path to improved thermoelectric properties, Physica B: Condensed Matter, vol. 383, Issue 1, Aug. 15, 2006, pp. 103-106.

Dames, Chris and Chen, Gang, "1ω, 2ω, and 3ω methods for measurements of thermal properties" Review of scientific Instruments 76, 124902 (2005).

Delan, A. et al., "Thermal conductivity of ultra low-k dielectrics," Microelectronic Engineering 70 (2003) 280-284.

Song, D. W. et al., "Thermal conductivity of skutterudite thin films and superlattices" Applied Physics Letters vol. 77, No. 23, Dec. 4, 2000, pp. 3854-3856.

(56) References Cited

OTHER PUBLICATIONS

Kim, E. K. et al, "Thermal boundary resistance at Ge2Sb2Te5/ZnS:SiO2 interface," Applied Physics Letters vol. 76, No. 26, Jun. 26, 2000 pp. 3864-3866.
Mavrokefalos, Anastassios et al., "Four-probe measurements of the in-plane Thermoelectric properties of nanofilms," Review of Scientific Instruments 78, 034901-1-034901-6 (2007).
Alvarez-Quintana, J. et al, "Extension of the 3w method to measure the thermal conductivity of thin films without a reference sample," Sensors and Actuators 0924-4247 Jan. 2007.
Liu, J.L. et al., "Growth of Ge Quantum dot superlattices for thermoelectric applications," Journal of Crystal Growth 227-228 (2001) pp. 1111-1115.
Cahill, David G., "Thermal conductivity measurements from 30 to 750K: the 3ω method," Review of Scientific Instrumentation, 61(2), Feb. 1990 pp. 802-808.
Wen-Lin Wang, Chi-Chao Wan and Yung-Yun Wang, "Composition-dependent characterization and optimal control of electrodeposited Bi2Te3 films for thermoelectric application", Electrochimica Acta, vol. 52, Issue 23, Jul. 10, 2007, pp. 6502-6508 Available online Apr. 24, 2007.
B. Zheng, S. Budak, R. L. Zimmerman, C. Muntele, B. Chhay and D. Ila, "Effect of Layer Thickness on Thermoelectric Properties of Multilayered Si1—xGe x/Si after Bombardment by 5MeV Si Ions", Surface and Coating Technology Available online Mar. 12, 2007.
S. Budak, C. I. Muntele, R. A. Minamisawa, B. Chhay, and D. Ila, " Effects of MeV Si ions Bombardments on Thermoelectric Properties of Sequenetially Deposited BixTe3/Sb2Te3 Nanolayers", Nuc. Instr. and Meth. B Available online Mar. 28, 2007.
S. Budak, C. Muntele, B. Zheng, D. Ila, " MeV Si ions Bombardement Effect on Thermoelectric Properties of Sequenetially Deposited SiO2/AuxSiO2(1-x) Nanolayers", Nuc. Instr. and Meth. B . Available online Mar. 28, 2007.
Ila et al., Nano-cluster engineer: A combined ion implantation/co-deposition and ionizing radiation, Nuclear Instruments and Methods in Physics Research B, 191, pp. 416-421, Feb. 8, 2002.
Xiao et al., MeV Si ion bombardments of thermoelectric BixTe3/Sb2Te3 multilayer thin films for reducing thermal conductivity, Nuclear Instruments and Methods in Physics Research B, 241, pp. 568-572, Aug. 15, 2005.
Zimmerman et al., Ion beam assisted formation of nanolayers, Nuclear Instruments and Methods in Physics Research B, 241, pp. 506-510, Nov. 4, 2005.
Budak et al., Effect of MeV Si Ion Bombardment on Thermoelectric Characteristics of Sequentially Deposited Si02/AuxSi02(1-x) Nanolayers, Materials Research Society Symposium Proceedings, 929, 0929-1104-10, Apr. 2006.
C.M. Cotell, S. Schiestel, C.A. Carosella, S. Flom, G.K. Hubler, D.L. Knies "Ion-beam-assisted deposition of Au nanocluster/Nb,O, thin films with nonlinear optical properties", US Naval Research Laboratory, Washington DC. Nuclear Instruments and Methods in Physics Research B 127/128 (1997) 557-561.
S. Schiestel, C.M. Cotell, C.A. Carosella, K.S. Grabowski, G.K Hubler "Ion beam assisted deposition of metal nanoclusters in silica thin films", US Naval Research Laboratory, Washington DC. , Nuclear Instruments and Methods in Physics Research B I27/ 128 1997) 566-569.
Namigashira, JP 2006117986 A, Machine Translation, originally published 2006, p. 1-35.
Ha, KR 100745619 B1, Machine Translation, originally published 2007, p. 1-8.
Subramanian, R., "Strength of Materials", 2010, Oxford University Press, 2nd Ed., p. 106.
Konov, V.I., et aI., "Pulsed laser deposition of hard coatings in atmospheric air". Applied Physics A 79,931-936 (2004).
Chen, Zhaoyang, et aI., "Effect of ambient pressure on laser ablation and plume expansion dynamics: A numerical simulation". Journal of Applied Physics 99,063304 (2006), pp. 1-9.
Wang, Bin, et aI., "Influence of ambient air pressure on the energy conversion of laser-breakdown induced blast waves". J. Phys. D: Appl. Phys. 46 (2013) 375201, pp. 1-7.
Nedyalkov, N., et aI., "Nanostructured Au film produced by pulsed laser deposition in air at atmospheric pressure". Optics & Laser Technology 64 (2014) 41-45.

* cited by examiner

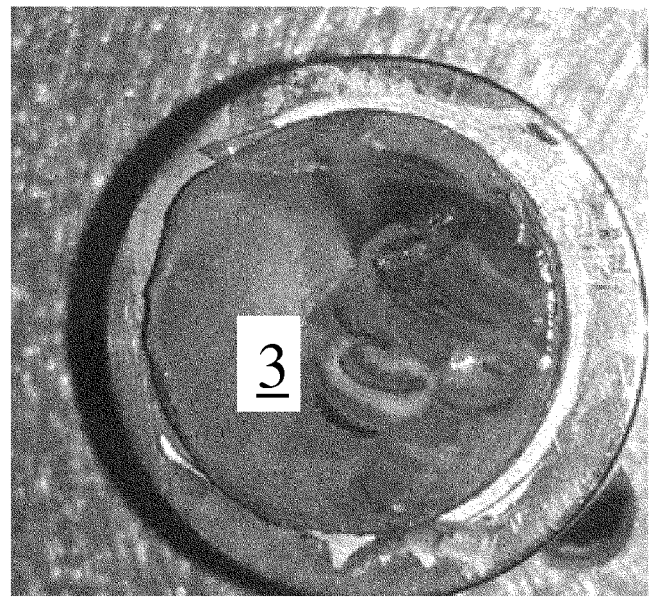
Fig. 6a
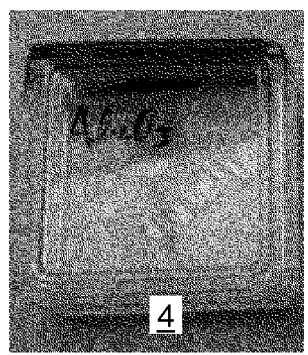 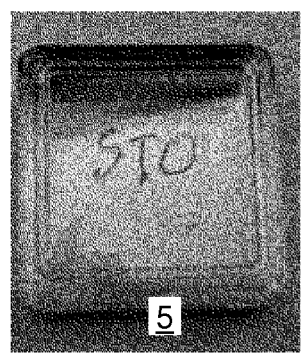 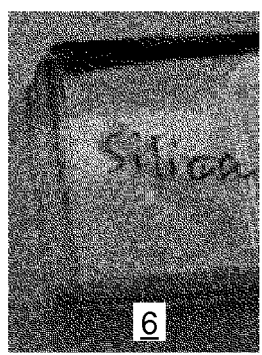
Fig. 6b  Fig. 6c  Fig. 6d

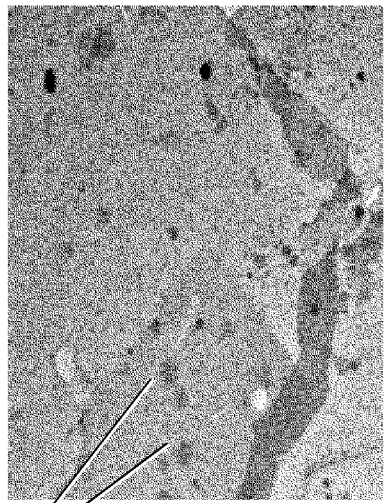# 
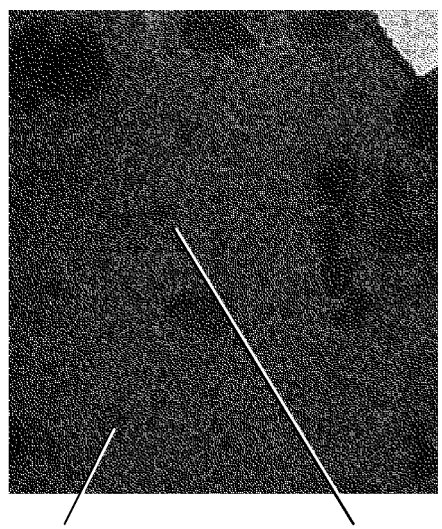
Fig. 7a
Fig. 7b
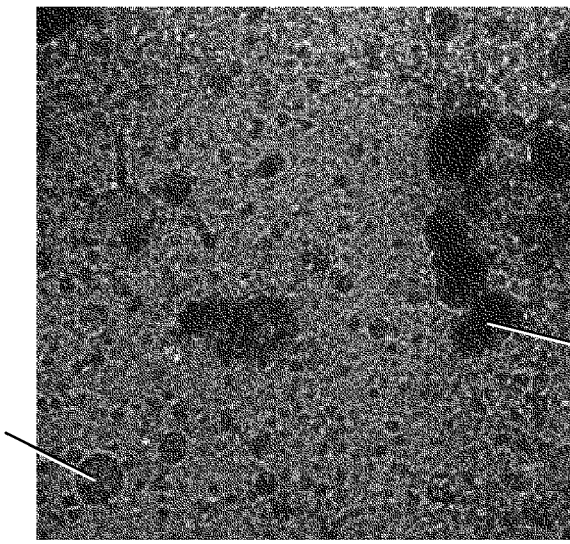
Fig. 7c

NANO-COMPOSITE THERMO-ELECTRIC ENERGY CONVERTER AND FABRICATION METHOD THEREOF

RELATED APPLICATIONS

This application claims the benefit under 35 USC 119(e) of provisional application Ser. No. 62/071,116, titled "Nano-composite thermo-electric energy harvester and fabrication method thereof", filed Sep. 15, 2014 by Darwish et al.; this application is a continuation in part of U.S. Ser. No. 14/506,685, titled: "Multiple Beam Pulsed Laser Deposition of Composite Films", filed Oct. 5, 2014 by Darwish et al., which is a continuation in part of U.S. Ser. No. 14/158,567, titled: "Multiple Beam Pulsed Laser Deposition of Composite Films", filed Jan. 17, 2014 by Darwish et al, which claims the benefit under 35 USC 119(e) of provisional application 61/850,330, titled "Method and Apparatus for multi-beam pulsed laser deposition of thin films", filed Feb. 14, 2013 by Darwish et al.

All of the above listed US Patent and Patent Applications are hereby incorporated herein by reference in their entirety.

GOVERNMENT LICENSE RIGHTS

The U.S. Government has a paid up license in this invention and the right in limited circumstances to require the patent owner to license others on reasonable terms as provided for by the terms of contracts FA9550-12-1-0068 and FA9550-12-1-0047 from US Air Force (Department of Defense), and W911NF-14-1-0093 and W911NF-15-1-0446 from US Army (Department of Defense).

BACKGROUND

Technical Field

The present invention pertains generally to the field of materials and devices for thermoelectric energy conversion including methods of producing the same.

Background

Thermoelectric materials are a class of materials that can efficiently convert between thermal energy and electrical energy. Only certain materials have been found usable with this property. Thermoelectric (TE) materials are useful in many applications. With TE materials, electricity can be employed to dissipate heat (thermoelectric coolers) or waste heat can be utilized to generate electricity (thermoelectric generators). Additionally TE devices have the advantage of no moving parts and thus are quiet, requiring little maintenance. Therefore, TE materials are useful in a wide variety of general applications such as refrigeration and power generation as well as niche applications such as cooling IR sensors, laser diodes and computer electronics, and powering space probes. However, the TE properties of these devices have been insufficient for broader application such as absorption chillers, which capture waste heat and then recycle the waste heat for industrial refrigeration. The low efficiency of TE devices is due to a low value of the basic materials' figure-of-merit, ZT. Typical state-of-the-art commercial TE materials can only achieve a ZT value of around 1. However, a conventional chiller or a waste heat recovery device might require a ZT of 2-3 for practical applications.

Thus, there is a great need for thin film flexible thermo-electric energy harvesting and conversion devices that can be used, for instance, to power wearable electronics using body heat or to convert heat waste produced by machinery, brakes, heat sinks, and other devices into electricity.

BRIEF DESCRIPTION

Briefly, the present disclosure relates to a nano-composite thermo-electric energy converter comprising a composite thin film inorganic semiconductor having polymer nano-clusters included within. The polymer nano-clusters improve a thermoelectric figure of merit ZT by increasing electrical conductivity and decreasing thermal conductivity. The converter may be fabricated by a dual beam pulsed laser deposition process. A first laser beam evaporates a target comprising the materials for the inorganic semiconductor. A second laser beam evaporates the polymer using a matrix assisted target for depositing the polymer concurrently with the semiconductor deposition to yield the composite film. The lasers may be separately controlled to determine the resulting composition. The converter may be deposited on rigid or flexible substrates for a wide range of applications.

The substrate may be made of various rigid materials including but not limited to fused silica (FS), sapphire $Al_2O_3$ (sapphire), and $SrTiO_3$ (STO).

The substrate may be made of a flexible material, including but not limited to polyimide.

In accordance with the present disclosure, an efficient TE material may be deposited using dual laser beam deposition along with nano-clusters of another material to disrupt the continuity of the TE material. Exemplary TE materials include, but are not limited to n-type Al doped ZnO (also referred to as AZO), silicon, germanium, silicon-germanium alloys, lead salts such as PbS, PbSe, PbTe, and $Bi_2Te_3/Sb_2Te_3$.

The inorganic semiconductor may be formed from a target comprising an inorganic material doped with a metal material.

In various variations, the polymer nano-clusters may include carbonized polymer comprising decomposition products of the polymer target. The polymer target may comprise PMMA and may comprise a solvent, for example, chlorobenzene. The polymer may be dissolved in the solvent and the solution frozen to a solid, for example a liquid nitrogen temperature.

In further aspects of the disclosure, the inorganic target and polymer target may be positioned with one target tilted to direct the target plume coincident on the substrate with the plume from the other target. One target may be tilted to accomplish plume axis intersection at the substrate.

The two laser beams may be fired concurrently to mix the depositions on the substrate.

In one variation, one laser beam is derived from the other laser beam, for example, by a nonlinear optical process. For example, one laser beam may be 1064 nanometers from a Q-switched Nd:YAG laser. The second beam may be a second harmonic at 534 nanometers. Other laser wavelength combinations may be used. The use of a harmonic has an advantage of providing precise timing coordination of the two beams. Alternatively, electronic timing coordination may be used and the lasers may be unrelated wavelengths or the same wavelength.

In one variation, a first laser beam may have a pulse length less than 20 nanoseconds and a fluence of greater than 100 $mJ/cm^2$. The second laser beam may have a pulse length less than 20 nanoseconds and a fluence of greater than 400 $mJ/cm^2$.

The thermoelectric converter may be further formed by creating thermal and electrical contacts, for example by depositing gold or silver contacts at two ends.

In one variation, the thermoelectric material may be produced by a dual (or double) beam and dual target pulsed laser deposition process with the first target being an inorganic target in the form of a solid pellet made of the components of an inorganic ceramic semiconductor thermoelectric material (such as Aluminum doped Zinc Oxide or AZO) to be evaporated by the first laser beam (in one variation—the second harmonic of the Nd:YAG laser, 532-nm wavelength) and the second target made of a solution of a polymer (such as poly(methyl methacrylate), also referred to as PMMA) dissolved in an organic solvent (such as chlorobenzene) and frozen to the temperature of liquid nitrogen and evaporated by the second laser beam (in one variation—the fundamental harmonic of the Nd:YAG laser, 1064-nm wavelength) using the MAPLE method (Matrix Assisted Pulsed Laser Evaporation). The polymer may be a long chain polymer with a degree of polymerization of $10^3$ to $10^6$. The process may thus incorporate intact long-chain polymer macro-molecules in the form of nano-clusters of entangled macro-molecules interconnected with a network of polymer nano-fibers made of straight polymer macro-molecules (twisted or placed in parallel to each other) in an inorganic host film with well controlled proportion and homogeneous composition.

These and further benefits and features of the present invention are herein described in detail with reference to exemplary embodiments in accordance with the invention.

BRIEF DESCRIPTION OF THE FIGURES

The present invention is described with reference to the accompanying drawings. In the drawings, like reference numbers indicate identical or functionally similar elements.

FIG. 6a shows another variation wherein aluminum zinc oxide-poly(methyl methacrylate) (AZO-PMMA) film was made on flexible substrate made of Kapton®.

FIG. 6b shows another variation wherein the substrate was single crystal $Al_2O_3$ (sapphire), 0.5 mm thickness.

FIG. 6c shows film prepared on $SrTiO_3$ (STO).

FIG. 6d show yet another variation wherein the substrate was amorphous fused silica (FS), 0.5 mm thickness.

FIG. 7a-FIG. 7c present scanning electron microscope (SEM) pictures of the nanocomposite films.

DETAILED DESCRIPTION

Figure 1:
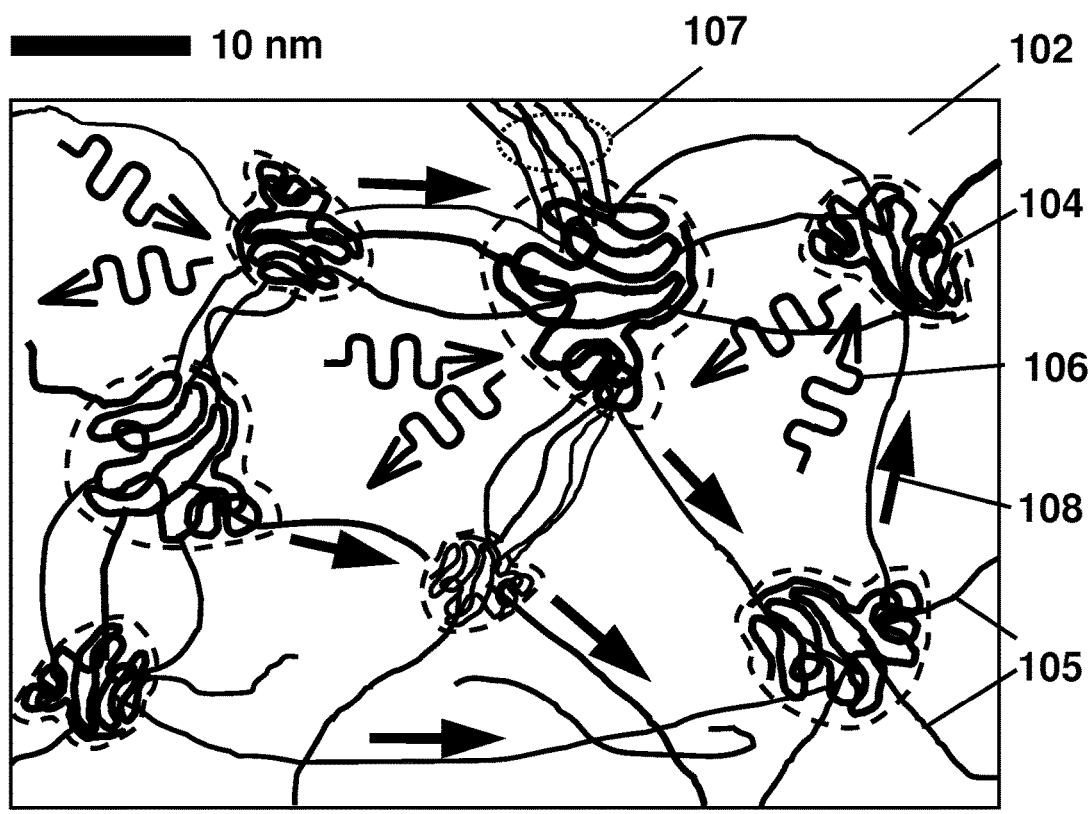
FIG. 1 depicts the effects of nano-clusters in a TE material in accordance with the present disclosure.

The thermoelectric (TE) energy converter uses a new concept of an inorganic (inorganic referring to materials lacking carbon) host (such as aluminum zinc oxide or AZO) impregnated with polymer (for example, PMMA) nano-clusters that decrease thermal conductivity and increase electro-conductivity due to carbonization. A carbonized polymer is a mixture of the polymer with decomposition products of the polymer including pure carbon in the form of highly electro-conductive graphite. A host material of a composite material is a continuous phase material in which a second phase is dispersed, for example, the continuous phase of AZO having dispersed nano-clusters. A Dual Beam Matrix Assisted Pulsed Laser Evaporation process (DB-MAPLE) may be used as part of the TE converter fabrication process. In this DB-MAPLE process, the matrix is a solvent in which a desired polymer material is dissolved and frozen in liquid nitrogen to form an organic laser evaporation target. Another laser beam ablates the target made of the inorganic host material. Materials from both targets are concurrently deposited on a dielectric substrate to form a thin film with TE harvesting capabilities. The TE converter may be operated to use a temperature difference to produce electrical energy. Alternatively, the TE converter may be operated by driving the TE converter with electrical energy to produce a temperature difference, which may be used for cooling, heating, or thermal control.

In accordance with the present disclosure, the thermoelectric effect was improved by incorporating nano-clusters in the AZO (and similar) host to decrease thermal conductivity, but simultaneously to increase electro-conductivity essential for reaching the figure-of-merit ZT higher than 2. The TE energy converter may include one or more of the following properties and advantages:

In one variation, the TE film is produced using a Dual Beam Matrix Assisted Pulsed Laser Evaporation (DB-MAPLE) process. The inorganic film is deposited using a first laser beam. The organic nano-cluster material is deposited using a second laser beam. Each laser beam is separately controllable. Thus, the deposition ratio of film to nano-cluster material may be varied as desired over a wide range. The growth rate and thickness of the final material may also be varied as desired. For AZO, the thickness may be varied from nanometers to millimeters.

Disturbances in the structure of the TE material are caused by nano-clusters of a different material. The size is sufficient to scatter thermal phonons. The nano-clusters are typically from 1 to 100 nanometers in diameter or width.

The dual laser approach allows simultaneous deposition of inorganic material and organic material, enabling inorganic AZO to be deposited simultaneously with an organic polymer such as PMMA to produce the nano-clusters in the AZO structure.

Separate control of the nano-cluster deposition allows control of the distribution and size of the nano-clusters.

The dual beam laser deposition allows the use of a wide range of substrates including but not limited to: rigid insulator materials, and flexible polymers, for example polyimide, for example Kapton®. The use of flexible substrates may enable wearable and/or surface conformable products.

The distribution of the inorganic and organic components in the material can be precisely controlled during the process of fabrication.

In the MAPLE process, a frozen matrix consisting of a dilute solution (1-5%) of a polymeric compound in a relatively volatile solvent (matrix) is used as the laser target. The solvent and concentration are selected so that first, the material of interest can dissolve to form a dilute, particulate free solution, second, the majority of the laser energy is initially absorbed by the solvent molecules and not by the solute molecules, and third, there is no photochemical reaction between solvent and the solute. The light-material interaction in MAPLE can be described as a photo-thermal process. The photon energy absorbed by the solvent is converted to thermal energy that causes the polymer to be heated but the solvent to vaporize. As the surface solvent molecules are evaporated into the gas phase, polymer molecules are exposed at the gas-target matrix interface. The polymer molecules attain sufficient kinetic energy through collective collisions with the evaporating solvent molecules, to be transferred into the gas phase. By careful optimization of the MAPLE deposition conditions (laser wavelength, repetition rate, solvent type, concentration, temperature, and background gas pressure), this process can occur without severe decomposition of the polymer molecules.

The figure of merit, ZT, may be defined as:

$$ZT = S^2 \sigma T / (\kappa_{el} + \kappa_{ph}), \quad (1)$$

where S is the Seebeck coefficient; $\sigma$ is the electrical conductivity; $S^2\sigma$ is the power factor; T is the temperature difference between the hot and cold contacts of the TE converter respectively; and $\kappa_{el}$ and $\kappa_{ph}$ are the electronic and phonon (lattice) components of the thermal conductivity, respectively.

FIG. 1 depicts the effects of nano-clusters 104, nano-fibers 105, and nano-bundles 107 in a nanocomposite TE material 102 in accordance with the present disclosure. Nano-clusters 104 are nano-sized disturbances in the uniform TE material 102. Nano-clusters 104 may be formed by depositing organic polymer material in the inorganic TE material 102. Nano-clusters 104 are generally large structures formed from particles of polymer material. Nano-fibers 105 may be formed by single polymer strands or bundles of parallel polymer strands (nano-bundles 107) embedded in the inorganic TE material. A typical deposition may include a mixture of nano-clusters 104, nano-fibers 105 and nano-bundles 107 as shown in FIG. 1. Nano-clusters may also be referred to as nano-particles, or nano-dots.

Large values of ZT suggest high power factor $S^2\sigma$, and low $(\kappa_{el}+\kappa_{ph})$ simultaneously. In uniform TE materials with simple microscopic structure (such as metals and semiconductors) an increase in S normally implies a decrease in $\sigma$ because of electric current carrier 108 density consideration, and an increase in $\sigma$ implies an increase $\kappa_{el}$ as given by the Wiedemann-Franz law, $\kappa_{el}/\sigma = L_0 T$ ($L_0$, Lorentz number). So the larger ZT is associated with larger S and smaller $\kappa_{ph}$ of a given material. But the freedom of manipulating S and $\kappa_{ph}$ is limited. In complex TE materials, such as nanocomposites, through material engineering Seebeck coefficient S and $\kappa_{el}$ are decoupled from electrical conductivity $\sigma$. Large ZT can be achieved through the increase of electrical conductivity $\sigma$ (without significant change of S and $\kappa_{el}$) by introducing additional channels for the electric current to flow, such as the electro-conductive networks formed by the nano-fibers 105 and nano-bundles 107. At the same time, ZT can grow due to the reduction of thermal conductivity $\kappa_{ph}$ because of phonon scattering centers 104 in the TE material 102, such as nano-clusters 104, as presented in FIG. 1. Assuming that Boltzmann transport equation is valid, thermal conductivity $\kappa_{ph}$ can be written as:

$$\kappa_{ph} = \frac{1}{3} C v \Lambda, \quad (2)$$

where C is the heat capacity; v is the group velocity; $\Lambda$ is the mean free path of the phonons 106. The phonons 106 scatter on the nano-clusters 104, their mean free path between the acts of scattering decreases with the increase of the concentration of the nano-clusters 104. Correspondingly, thermal conductivity decreases and ZT factor increases. The proposed nanocomposite TE material with the network of electro-conductive nano-fibers and nano-bundles and with phonon scattering nano-clusters falls in the class of the so-called "electron crystals and phonon glasses" with potentially the largest possible ZT.

In accordance with the present disclosure, an efficient TE material is deposited using dual laser deposition along with nano-clusters and nano-fibers of another material to disrupt the continuity of the TE material. Exemplary TE materials include, but are not limited to n-type Al doped ZnO thin film (also referred to as AZO), silicon, germanium, silicon-germanium alloys, lead salts such as PbS, PbSe, PbTe, and $Bi_2Te_3/Sb_2Te_3$. Nano-clusters and nano-fibers may be sourced from organic polymer materials including but not limited to poly(methyl methacrylate), also referred to as PMMA.

Al-doped ZnO (AZO) is an efficient TE material. ZnO is an n-type semiconductor with wide direct band gap (3.3 eV) which has versatile applications such as optical devices in ultraviolet region, piezoelectric transducers, and transparent electrode for solar cells, gas sensors. ZnO is also a good candidate for thermoelectric applications because of its low cost, low toxicity, and stability over a wide temperature range (decomposition temperature higher than 2000° C.). Pure and doped sintered ZnO has been studied as thermoelectric material for space applications, solar-thermal electrical energy production, and other applications. Several reports were published on sintered ZnO with various dopants added in order to improve its thermoelectric performance. Dopants enter in a host material in the form of atoms or ions of foreign elements and in this regard essentially differ from nano-clusters, which are composed of hundreds or thousands of atoms of a foreign material (foreign to the host).

Thin film materials may have advantages over bulk materials because thin film structures may more easily allow modification of the properties of materials at the nanometer scale. Thermoelectric performance of $Bi_2Te_3/Sb_2Te_3$ thin films has been enhanced by introduction of nano-sized defects (such as nano-precipitates) to control the phonon scattering. The main drawback of BiTe and related materials is that at T>600K they become unstable or decompose, limiting the range of practical applications. In bulk oxides like ZnO, nano-defects form randomly, and the nano-defect density and size are difficult to control. In accordance with the present disclosure nano-defects are introduced in thin films of ZnO to improve TE performance.

Thin uniform (without nano-defects, the difference between dopants and nano-clusters creating nano-defects was explained earlier) films of 2% Al doped ZnO (AZO) can be fabricated by single beam pulsed laser deposition (PLD) on $SrTiO_3$ (STO) and $Al_2O_3$ (sapphire) substrates. The aluminum percentage may be preferably from 0.3% to 10%, more preferably from 1% to 5%, and more preferably from 1.5% to 3%. For example, the 2% AZO thin films were grown by PLD technique using a pulsed Nd:YAG laser (10 Hz pulse repetition rate). PLD target was a pellet of $Zn_{0.98}Al_{0.02}O$ (Aluminum 2% of the total by weight compared with the zinc, not counting the oxygen) (20 mm in diameter and 3 mm in thickness). The pellet was prepared by Spark Plasma Sintering (SPS), also referred to as Pulsed Electric Current Sintering (PECS). In SPS pulsed DC current is passed through a graphite die, as well as the AZO powder compact. Joule heating plays a dominant role in the densification of the powder compact, which results in achieving near theoretical density at a lower sintering temperature compared to conventional sintering techniques. The heat generation is internal, in contrast to the conventional hot pressing, where the heat is provided by external heating elements. This facilitates a very high heating or cooling rate (up to 1000 K/min), hence the sintering process is generally very fast (within a few minutes). The general speed of the process ensures it densifies the powder without coarsening, which accompanies standard densification routes. While the term "spark plasma sintering" is commonly used, a literal interpretation of the term may be misleading since neither a spark nor a plasma is present in the process. The 2% Al was a dopant (bringing the thermoelectric property) of the bulk material in the target. The laser beam was shot on the dense AZO target with an energy density of 4.2 $J/cm^2$ for a deposition period of 30 min. The energy density could vary within range 0.3 to 10.0 $J/cm^2$. The energy density below the 0.3 $J/cm^2$ was not sufficient to generate the plasma plume and initiate the deposition process. The energy density above 10.0 $J/cm^2$ resulted in an undesirably violent process of plasma formation accompanied by a shock wave causing premature destruction of the target. The deposition period may be extended to achieve any desired thickness of the material. Thin films were deposited on single crystal plates of $SrTiO_3$ (STO), crystal orientation (100), and $Al_2O_3$ (sapphire), crystal orientation (100), at 300° C., 400° C., 500° C., and 600° C. under oxygen pressure of 200 mTorr (found experimentally to be optimal for the dissipation of the energy of the hot plasma of the plume before the condensation on the substrate and thus stabilizing the resulting film). Oxygen pressure could vary within range 150-250 mTorr. This corresponds to a mean free path of the plasma ion in oxygen atmosphere of 0.3 to 0.5 mm. This mean free path allows multiple collisions (from 70 to 120 collisions; the distance between the target and the substrate was 35±5 mm) between plasma ions and oxygen molecules so that the plasma ions will lose kinetic energy and precipitate on the substrate. The selection of oxygen as a filling gas was dictated by the fact that the mass of the oxygen molecule $O_2$ (32) was close enough (~2.5 less) to the mass of the molecule of ZnO (81) to secure efficient energy withdrawal from the ions of the target material (ZnO) during each act of collision (a preferred efficiency would be if the masses were equal). The target was rotated during the irradiation of the laser beam for more uniform erosion of the target and to prevent pits and resulting plume variations. The substrates were glued with silver-filled electro- and thermoconductive adhesive on an Inconel plate. The thickness of the deposited thin films was 500±50 nm. Deposition parameters, including pulse frequency 10 Hz, the substrate-target distance 35±5 mm, and a rotation speed of the target 30 rpm, were kept unchanged during all the deposition routes.

The structural characterization of the uniform AZO films was done by X-ray diffraction (XRD) (Bruker D8 Discover), and morphology was checked by scanning electron microscope (SEM) (JEOL, FESEM). The thickness and in-plane roughness were obtained by 3D-microscope Keyence VK-9700. The electrical conductivity vs. temperature characteristics was measured by a four-probe technique from 300 to 600K with apparatus comprising a current source (ADCMT 6144), temperature controller (Cryocon 32), and nanovoltmeter (Keithley 2182A). Seebeck coefficient was measured by a commercially available system (MMR Technologies, Inc.) in the temperature range 300K-600K.

In summary, the uniform AZO films deposited on $Al_2O_3$ (sapphire) are epitaxial and fully c-axis oriented, showing only (002) peak in θ-2θ XRD patterns. Epitaxy refers to the deposition of a crystalline overlayer on a crystalline substrate. Films deposited on STO are c-axis oriented for a deposition temperature of 400° C., although at higher deposition temperatures a-axis orientation (110 peak) appears. Except for a deposition temperature of 400° C., films deposited on STO show higher values of σ, S (Seebeck coefficient), and $\sigma S^2$ (power factor) in comparison with the films deposited on $Al_2O_3$. Best values are obtained on STO at a deposition temperature of 300° C.: $\sigma_{STO}$=382 S/cm (siemens/cm), $S_{STO}$=−121 μV/K, $(\sigma.S^2)_{STO}$=0.55 $mWm^-_1K^{-2}$ (T=600 K) overcoming the best results reported in literature. Different behavior may be explained by larger epitaxial strain and larger concentration of dislocations of $AZO/Al_2O_3$ versus AZO/STO.

A. Identification of Component Parts of the System

Figure 2:
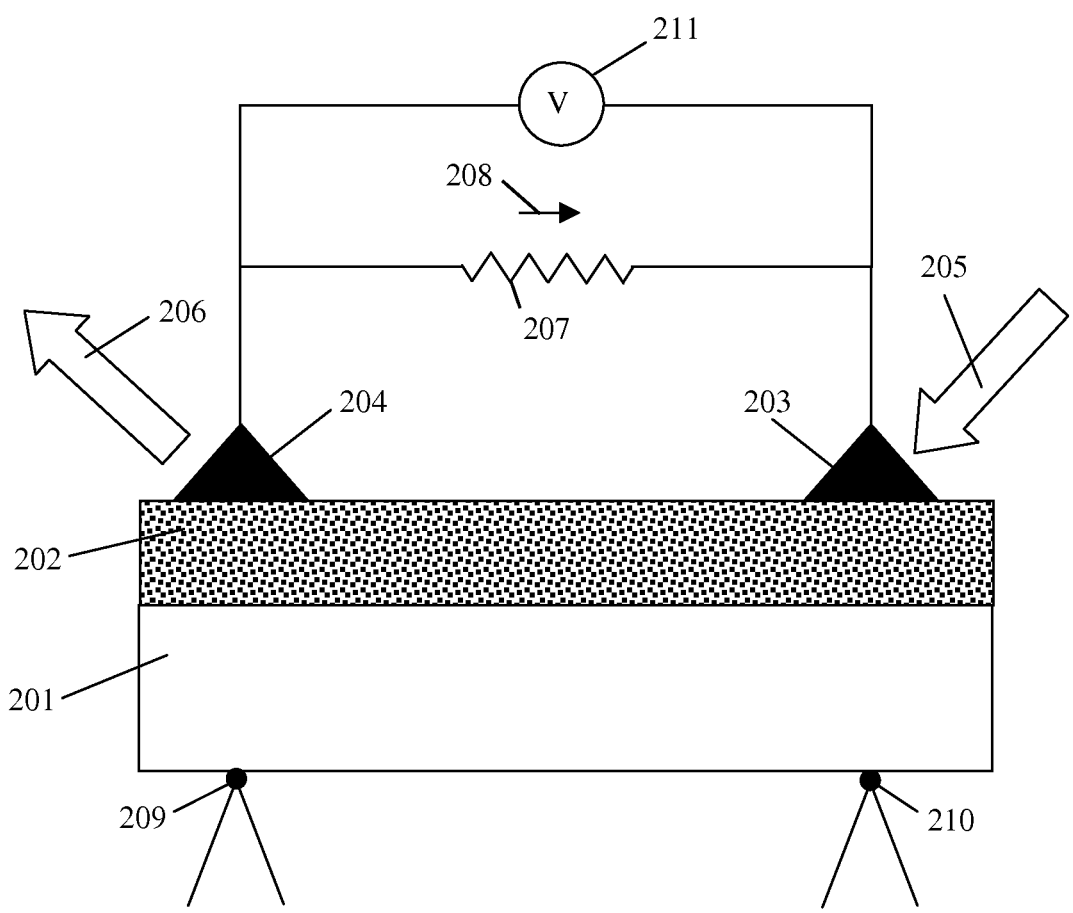
FIG. 2 illustrates an exemplary schematic diagram of an energy converter in accordance with the present disclosure.

FIG. 2 illustrates an exemplary schematic diagram of an energy converter in accordance with the present disclosure. The device comprises substrate 201, TE inorganic-polymer nanocomposite film 202, "hot" and "cold" electric contacts 203 and 204 respectively, heated and cooled by heat fluxes 205 and 206 respectively, and resistive electric load 207. The incoming heat flux 205 heats up hot contact 203. The outgoing heat flux cools contact 204 down. The temperature gradient T along the TE layer 202 creates electro-motive force (e.m.f.) that drives electric current 208 through the closed external circuit including load 207. The energy of heat is thus harvested and converted into electricity.

B. Fabrication Method

The method of fabrication of the TE converter may include a further improvement of the pulsed laser deposition. Pulsed laser deposition of a single target material on a substrate includes the sequence of the following processes: (a) heating a single target with the laser pulse; (b) melting the heated target material followed by its vaporization; (c) ionizing the atoms of the vaporized target material by the electrons accelerated in the strong electric field of the laser pulse and creating weakly ionized plasma; (d) expansion of the plume made of the weakly ionized plasma driven by electrostatic repulsion of the positive ions of the target material towards the ambient gas or vacuum separating the target from the substrate; (e) condensation of the target material from the plume on the substrate and thin film formation. Since the spread of the plume is driven by electrostatic repulsion, the axis of the plume is normal to the surface of the target regardless of the direction of the incident laser beam.

Figure 3:
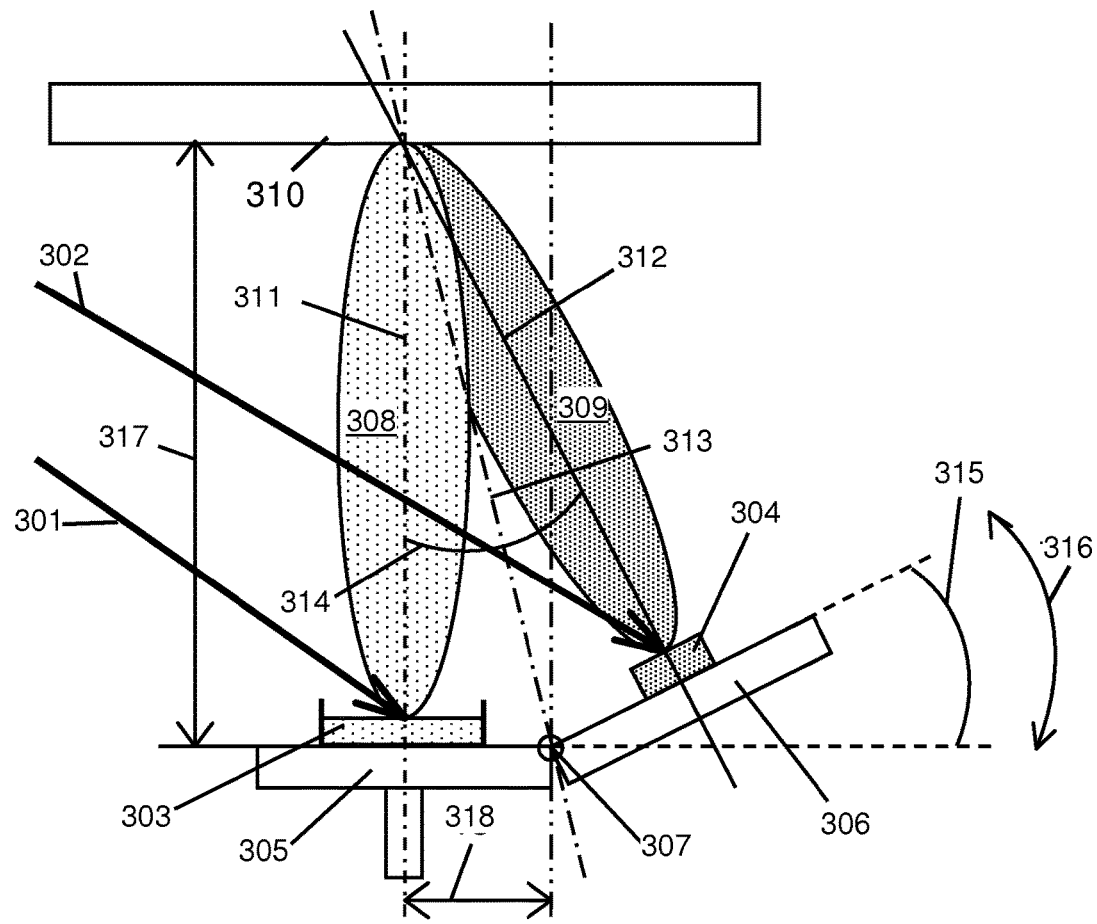
FIG. 3 depicts an exemplary dual beam laser deposition apparatus in accordance with the present disclosure.

FIG. 3 depicts an exemplary dual beam laser deposition apparatus in accordance with the present disclosure. The new double-beam method uses two laser beams to ablate/evaporate concurrently two targets with two different materials: polymer and inorganic compound. There should be an optimal tilt angle between the targets. The optimal tilt can be understood from FIG. 3 presenting the schematic of the dual target holder. Schematic of the configuration of the pulsed laser deposition with two laser beams and two targets includes the following: 301—the 1-st laser beam; 302—the 2-nd laser beam; 303—the 1-st target (frozen polymer solution in case of MAPLE); 304—the 2-nd target (compressed pellet of the powder of the inorganic material); 305—the holder of the 1-st target (cooled with liquid nitrogen in case of MAPLE); 306—the holder of the 2-nd target with variable tilt; 307—the hinge; 308—the plume from the 1-st target; 309—the plume of the 2-nd target; 310—the substrate; 311—the axis of the 1-st plume normal to the surface of the 1-st target; 312—the axis of the 2-nd plume normal to the surface of the 2-nd target; 313—the bisector of the angle between axes 311 and 312; 314—the angle between axes 11 and 12; 315—the angle of tilt of holder 6; 316—the direction of tilt of holder 6; 317—the distance between stationary target holder 305 and substrate 310; 318—the distance between the spot of the 1-st target where laser beam 301 hits and hinge 307 (preferably about equal to the distance from the spot of the 2-nd target where laser beam 302 hits and hinge 307). The target holder is split in two halves: the static holder 305 of the 1-st target and holder 306 of the 2-nd target with variable tilt. Holder 306 rotates around hinge 307. The optimal tilt angle θ is reached when the plumes from both targets overlap on the substrate, in other words, their axes 311 and 312 intersect on the surface of substrate 310. One can see from FIG. 3 that tilt angle 315 is equal to angle 314 between axes 311 and 312 of the respective plumes. In case the laser beams hit the targets in the locations at the same distance from hinge 307, bisector 313 of angle 314 passes through hinge 308 and the point on the surface of substrate 310 where axes 311 and 312 of both plumes intersect. Correspondingly, the optimal tilt angle can be calculated as $$\theta = 2\tan^{-1}(d/l), \quad (3)$$

where d is the distance between the spots of the targets exposed to the laser beams and hinge 307 (distance 318 in FIG. 3); l is the distance between stationary target holder 306 and substrate 310 (distance 317 in FIG. 3). The optimal tilt angle was be pre-set before the laser deposition and further adjusted during the trial laser deposition process to correct possible errors related to the shift of the laser beams along the targets, change of the distance between the targets and the substrate, etc. For instance, the distance l between substrate 310 and target holder 306 could be 1" (2.54 cm) and distance d=0.25" (0.635 cm). Correspondingly, the optimal tilt angle would be 14.0°.

Figure 4:
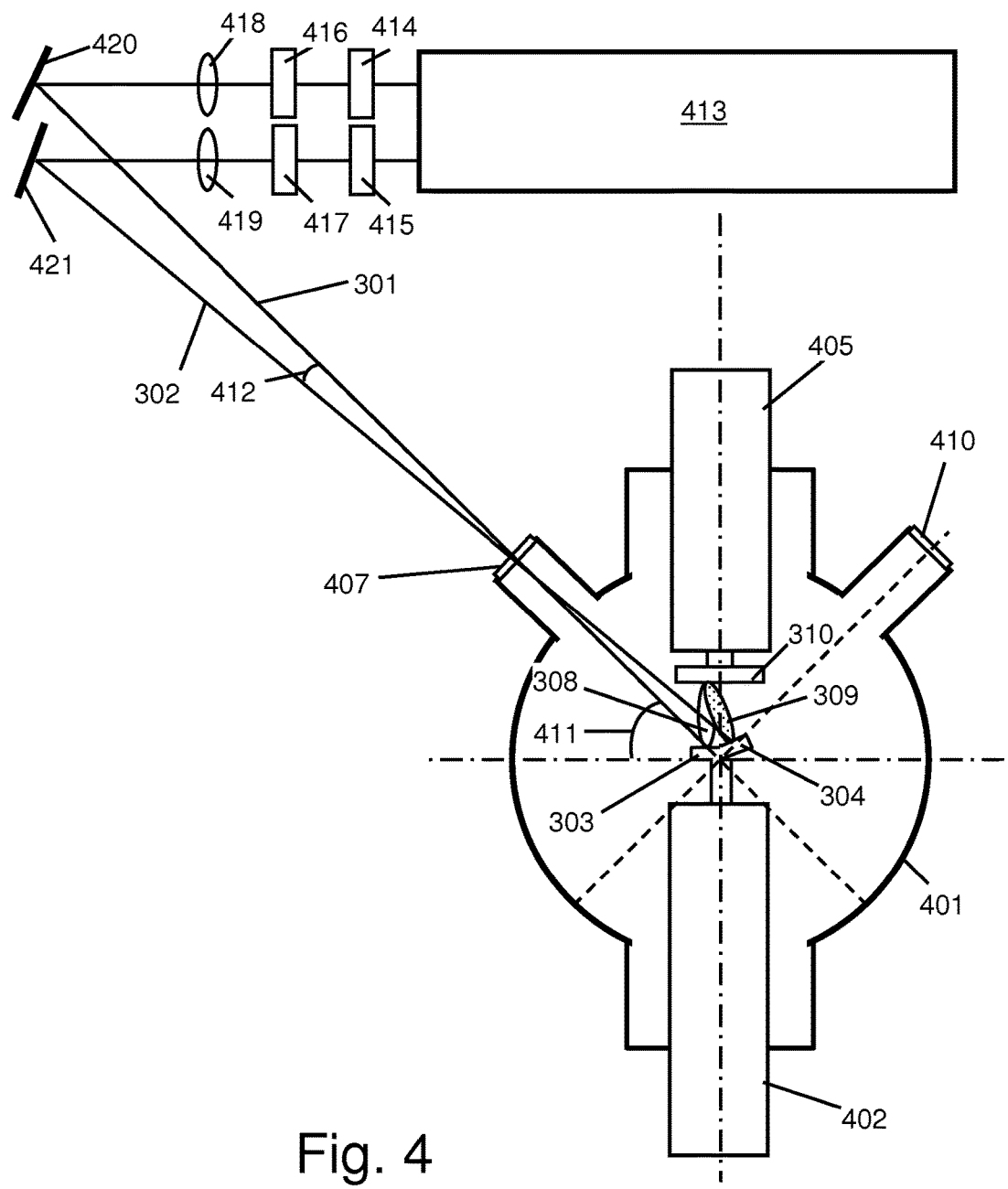
FIG. 4 illustrates additional features of the dual laser beam deposition system of FIG. 3.

FIG. 4 illustrates additional features of the dual laser beam deposition system of FIG. 3. Referring to FIG. 4, the system may be used for a DB-MAPLE process and includes the following: 401—the vacuum chamber; 402—the target manipulator; 303—the fixed target; 304—the tilted target; 405—the substrate manipulator; 310—the substrate; 407—the flange with optical window for laser beams; 408—the infra-red laser beam (1064 nm wavelength); 409—the visible laser beam (532 nm wavelength); 410—the flange with optical window for observation and mounting video camera; 411—the angle between laser beam 408 and the horizontal axes of chamber 401; 412—the angle between laser beams 408 and 409; 413—the laser; 414 and 415—the computer controlled laser beam shutters; 416 and 417—the laser beam attenuators; 418 and 419—the laser beam focusing lenses; 420 and 421—the laser beam steering mirrors; 422 and 423—the plasma plumes from the targets. Spherical vacuum chamber 401 provides access and mounting ports for various components of the system. Target manipulator 402 holds the first, fixed target 303 and the second, tilted target 304 (detailed schematic of the targets is presented in FIG. 3). Substrate manipulator 405 holds a stage with substrate 310 mounted on it. Flange 407 with optical window is the optical port for laser beams 301 (1064 nm wavelength) and 302 (532-nm wavelength). Flange 410 with optical window is used for observation and mounting a video camera. Laser beam 301 is directed at angle 411 (~45°) with respect to the horizontal axes of the chamber. Laser beam 302 makes angle 412 with respect to beam 301. Laser 413 (Nd:YAG Q-switched laser with the second harmonic generation unit) generates the two pulsed laser beams 301, 302. Computer controlled optical shutters 414 and 415 independently block each laser beam. Laser beam attenuators 416 and 417 are used to regulate the fluence dependent target ablation rate and respectively the mixing proportion of the materials of both targets in the deposited film. Focusing lenses 418 and 419 are used to adjust the laser spot size on each target. Steering mirrors 420 and 421 control the positions of the laser beams on the corresponding targets. Plasma plumes 308 and 309 propagate from targets 303 and 304 respectively after they are exposed to the laser beams. The spherical vacuum chamber has a diameter of 12 inches (~30 cm). The chamber is connected to a two-stage vacuum pumping system including a mechanical and turbo pumps and the gas filling station (not shown).

AZO and PMMA on Various Substrates

Figure 5A:
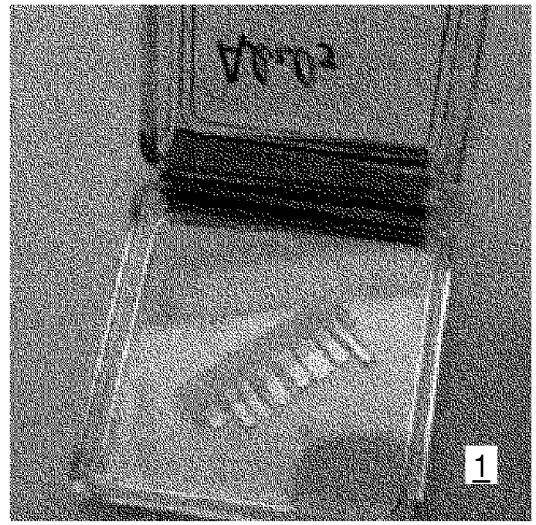
FIG. 5a shows a variation wherein the substrate was single crystal $Al_2O_3$ (sapphire), 0.5 mm thickness.
Figure 5B:
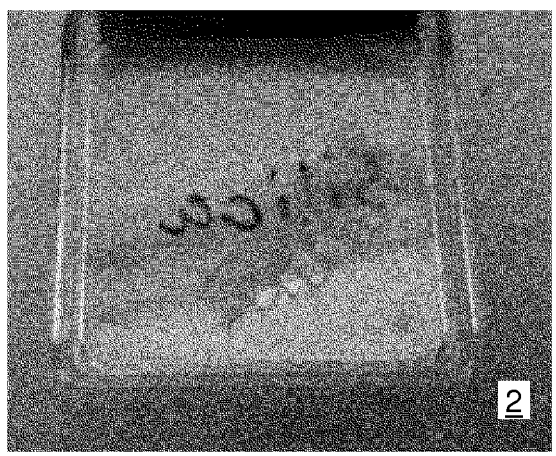
FIG. 5b shows another variation wherein the substrate was amorphous fused silica (FS), 0.5 mm thickness.

In one embodiment, a sample of the solution of polymer poly(methyl methacrylate) known as PMMA in chlorobenzene at a proportion of 0.5 g solids per 10 mL liquids was poured in a copper cup of the MAPLE target holder and frozen in liquid nitrogen. Then the copper cup with the frozen polymer solution was installed in the vacuum chamber. Target 2 was AZO (2% Al-doped ZnO) ceramic $Zn_{0.98}Al_{0.02}O$ disc prepared by conventional sintering in air at 1400° C. The disk was retained in the second, small target holder. The laser source was a Spectra Physics Quanta Ray Nd:YAG Q-switched Lab-170-10 laser with a pulse repetition rate of 10 Hz, 850-mJ energy per pulse at the 1064 nm fundamental wavelength and 450-mJ energy per pulse at the 532-nm second harmonic. Frozen polymer target 303 was ablated with the 1064 nm laser beam. Inorganic target 304 was concurrently ablated with the 532-nm beam. The major reason for choosing 1064 nm beam for target 303 was that the MAPLE required more energetic laser pulse with a threshold fluence (energy density) of 400 mJ/cm². The threshold fluence is the minimum fluence (energy density) at which evaporation and deposition occur. The threshold fluence (energy density) of the green (532-nm) laser pulse for solid inorganic target 304 was 100 mJ/cm². The optimal fluence (energy density) for target 303 (the MAPLE target) was found to be within range 750-850 mJ/cm². This corresponded to a film deposition rate of 0.01 nm/pulse. Further increase of the fluence resulted in more violent evaporation of the target and poor quality of the deposited film. There was also a risk of significant photochemical decomposition of the dissolved polymer molecules. The deposition parameters were within the range typical for the single-beam MAPLE deposition of polymer films and, particularly, for the single-beam used to deposit a polymer nanocomposite film. The total time of the deposition process was not exceeding 30 min. Four types of substrates were used: (1) single crystal sapphire ($Al_2O_3$) plates with a thickness of 0.5 mm; (2) amorphous fused silica (FS: $SiO_2$) plates with a thickness of 0.5 mm; (3) single crystal strontium titanate $SrTiO_3$ (STO) plates with a thickness of 0.5 mm; (4) flexible Kapton® polyimide polymer disks with a thickness of 0.1 mm. Two types of the films were prepared: (a) pure AZO films as control samples and (b) AZO-PMMA nanocomposite films. Eight pieces (0.5 cm×0.2 cm) of sapphire plate with pure AZO film deposited are shown in FIG. 5*a* as item 1; eight pieces (0.5 cm×0.2 cm) of fused silica (FS) plate with pure AZO film deposited are shown in FIG. 5*b* as item 2.

Kapton® polyimide disk with the nanocomposite AZO-PMMA film deposited is shown in FIG. 6*a* as item 3. It can be potentially used in wearable thermal energy converters.

Eight pieces (0.5 cm×0.2 cm) of sapphire plate with nanocomposite AZO-PMMA film are shown in FIG. 6*b* as item 4. Eight pieces (0.5 cm×0.2 cm) of STO plate with nanocomposite AZO-PMMA film are shown in FIG. 6*c* as item 5. Eight pieces (0.5 cm×0.2 cm) of fused silica (FS) plate with nanocomposite AZO-PMMA film are shown in FIG. 6*d* as item 6.

The control sample (pure AZO) films were all deposited by the single beam method using the second harmonic (532 nm) of the pulsed Nd:YAG laser.

The thickness of the nanocomposite films was (500±50 nm): 30 min deposition time at a pulse repetition rate of 10 Hz. In the nanocomposite films, main matrix phase was AZO. PMMA was kept at a weight proportion between 0.1 to 0.5% to form PMMA nano-clusters and the network of nano-fibers embedded in the inorganic host matrix. All substrates were held at room temperature for each deposition.

After the deposition, all the films deposited on the solid substrates were heat treated in vacuum. They were heated by ramping the temperature at a heating rate of (5±1) K/min from room temperature (293K) to 600K (1 hour total heating time) and then cooled for 5 hours down to the room temperature. Heat treatment was conducted 10 times. The slow heating and cooling rates was chosen to prevent cracking of the films and peeling them off the substrates due to the stress originated from the difference in thermal expansion coefficients of the films and the substrates. The number of heat treatment cycles was sufficient to stabilize the response of the electrical conductivity to the temperature and make it reproducible.

Characterization of the deposited films was performed with SEM, electrical conductivity, thermal conductivity, and Seebeck coefficient measurements.

FIG. 7*a*-FIG. 7*c* presents the SEM pictures of the nanocomposite films. Polymer nano-clusters 702 of a size of 10-50-nm can be seen embedded in the AZO host.

The existence of the polymer nano-clusters inside the inorganic host film is confirmed with the scanning electron microscope images. The polymer nano-clusters are formed as a result of entanglement of the polymer molecules triggered by various effects, such as spikes in local electric fields, chemical interactions between adjacent polymer molecules during their condensation on the substrate and chemical interactions with the inorganic host.

Both polymer nano-clusters and nano-fibers (but especially, nano-clusters as larger formations) scatter phonons in the host, thus reducing the thermal conductivity.

Figure 8A:
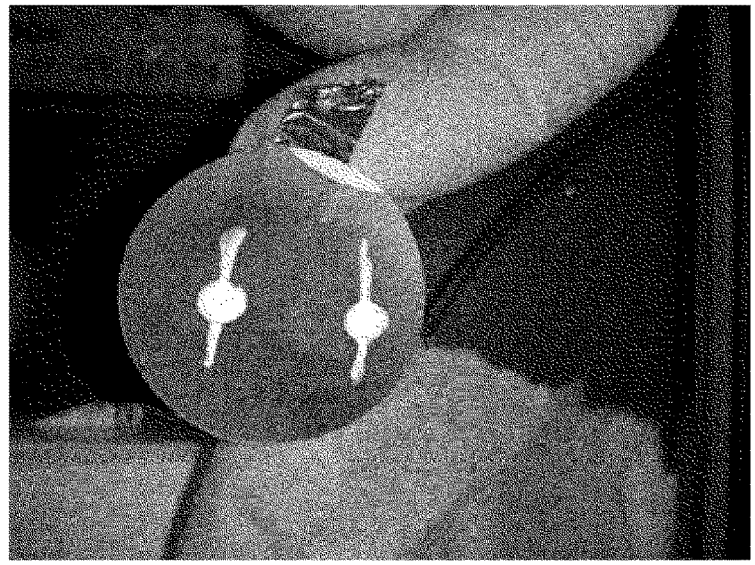
FIG. 8a shows the Kapton® substrate with silver contact pads made from silver conductive paste before the deposition of the AZO-PMMA nanocomposite film.

FIG. 8*a* shows the Kapton® substrate with silver contact pads made from silver-based conductive epoxy before the deposition of the AZO-PMMA nanocomposite film.

Figure 8B:
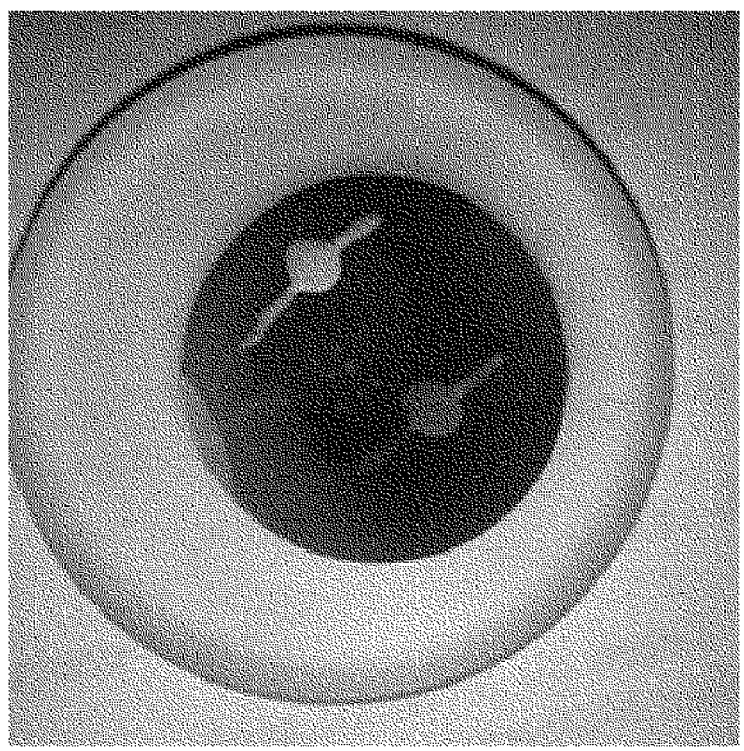
FIG. 8b shows the films deposited on the Kapton® flexible substrate using the pulse laser deposition method.

FIG. 8*b* shows the films deposited on the Kapton® polyimide (also known as poly (4,4'-oxydiphenylene-pyromellitimide)) flexible substrate using the pulse laser deposition method.

Electrical Conductivity Measurements

Figure 9A:
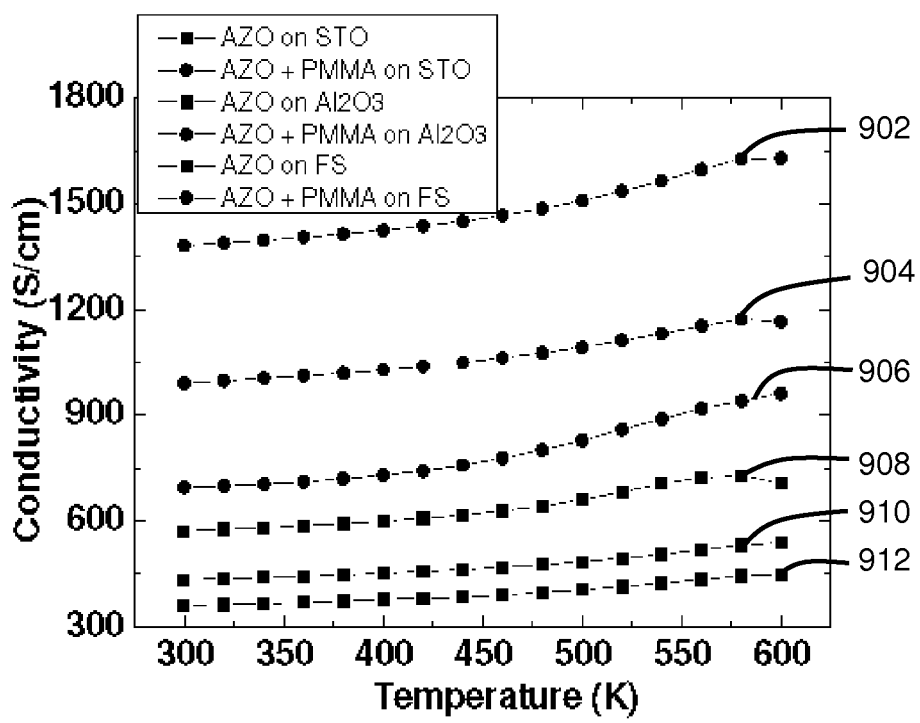
FIG. 9a presents the electro-conductivity of the deposited films versus the temperature.

FIG. 9*a* presents the electrical conductivity of the films deposited on the solid substrates versus the temperature of the film. In all the cases the electrical conductivity of the AZO-PMMA nanocomposite films increased with respect to the pure AZO films. This was due to carbonization of the polymer nano-clusters and nano-fibers that took place mainly due to the post-deposition heat treatment. Carbonization occurs as a pyrolysis—a thermochemical decomposition of organic material at elevated temperatures without oxygen (or any halogen). It involves the simultaneous change of chemical composition and physical phase. Pyrolysis is a type of thermolysis, and is most commonly observed in organic materials exposed to high temperatures. It is one of the processes involved in charring wood, starting at 200-300° C. (390-570° F.). It also occurs in fires where solid fuels are burning or when vegetation comes into contact with lava in volcanic eruptions. In general, pyrolysis of organic substances produces gas and liquid products and leaves a solid residue richer in carbon content, char. Pyrolysis leading to carbonization and the increase of electroconductivity of polymers (such as PMMA, poly(vinylidene fluoride)—PVDF, poly (acrylonitrile)—PAN, and poly-N-vinylformamide—PNVF), during the laser ablation and heat treatment have been reported before and used to modify the electrical conductivity of polymer coatings and fibers (G. B. Blancet and C. R. Fincher, Jr., Laser induced unzipping: A thermal route to polymer ablation, Appl. Phys. Lett. Vol. 65, No. 10, 1994, 1311-1313; N. Morita, Y. Shimotsuma, M. Nishi, M. Sakakura, K. Miura, and K. Hirao, Direct microcarbonization inside polymer using focused femtosecond laser pulses, Appl. Phys. Lett. Vol. 105, 2014, 201104, 4 pages; M. Molenda, M. Swietoslawski, M. Drozdek, B. Dudek, and R. Dziembaj, Morphology and electric conductivity of carbon nanocoatings prepared from pyrolized polymers, J. of Nanomaterials vol. 2014, Article ID 103418, 7 pages).

DB-MAPLE process introduced nano-clusters and nano-fibers composed of mostly intact long chain molecules of polymer PMMA in the AZO host films. The heavily entangled polymer molecules formed the nano-clusters as shown in FIG. 7. Straight polymer molecules self-assembled in individual fibers or fiber bundles forming networks across the host (FIG. 1). The polymer nano-clusters increased phonon scattering and reduced thermoconductivity of the nanocomposite films.

Heat treatment of the freshly deposited AZO-PMMA nanocomposite films is conducted to carbonize the embedded polymer nano-clusters and the net of interconnected nano-fibers. Carbonization makes the polymer nano-clusters and nano-fibers highly electrically conductive. As a result, the additional electrically conductive network increases the overall electrical conductivity of the nano-composite film. The increase of the electrical conductivity occurs without significant change in the Seebeck coefficient and the electronic component of the thermal conductivity.

The decrease of the thermal conductivity and the increase of the electrical conductivity introduced in the AZO host by the carbonized polymer nano-clusters and the network of nano-fibers increase the figure of merit ZT.

After carbonization of the polymer nano-fibers caused by the heat treatment the additional passages for the electric current were formed thus increasing the electrical conductivity. These two effects of the polymer were useful for the enhancement of the TE figure of merit ZT.

Electrical Conductivity Measurement System

Electrical conductivity of the energy converter was measured using the four-probe method. The measurement system included:

1. Current source ADCMT 6144 from ADCMT, Japan
2. Temperature controller Cryo-con 32, USA
3. Nano-voltmeter Keithley 2182A, USA
4. Sample holder MMR technologies (USA) mod. R2500-27

Figure 9B:
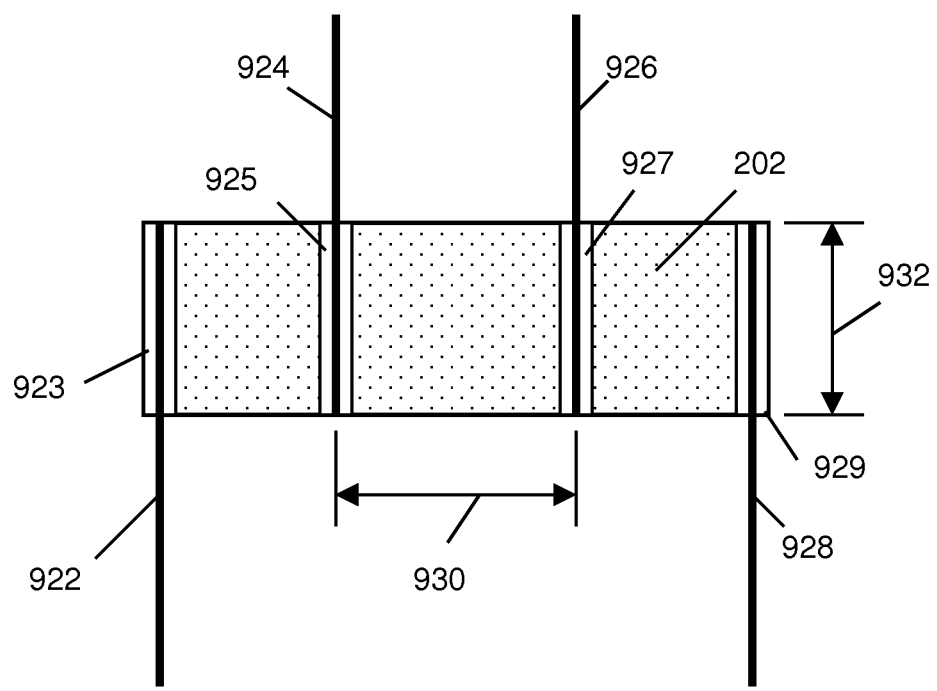
FIG. 9b is a schematic of the four-probe electrical conductivity measurement setup.

FIG. 9b is a top view schematic of the four-probe electrical conductivity measurement setup. Referring to FIG. 9b, a top view of a deposited film 202 is shown with four contacts 922, 924, 926, 928. The width dimension, w 932, is shown. The distance, L 930, between the voltage pads 924 and 926 is shown. H is the thickness dimension not directly visible from the top view. L is the separation between voltage pads and w is the sample width. Gold or silver contact pads 923, 925, 927, and 929 are deposited of the top of the thermo-electric film 202. 50-micron thick golden wires are glued to the contact pads with a conductive adhesive. Electrical conductivity σ is calculated as inverse of resistivity ρ (σ=1/ρ) of the thin film. Resistivity ρ is obtained using Ohm's law ρ=VwH/IL, where V is the voltage between wires "$V_+$" 924 and "$V_-$" 926; I is the electric current through the film (0.01 mA); w is width 932 of the film; H is the thickness of the film; L is distance 930 between the "$V_+$" and "$V_-$" wire electrodes. The temperature was ramped up from 300K to 600K.

Sample Measurement Results

Referring again to FIG. 9a, the square symbol is for pure AZO film only. The circular dot symbol is for AZO with PMMA nanocomposite film.

Plot 902 is AZO+PMMA on $Al_2O_3$ (sapphire).
Plot 904 is AZO+PMMA on Fused Silica (FS).
Plot 906 is AZO+PMMA on STO.
Plot 908 is AZO on STO.
Plot 910 is AZO on $Al_2O_3$ (sapphire).
Plot 912 is AZO on Fused Silica (FS).

PMMA is a dielectric material. However, carbonization of the polymer nano-fibers embedded in the AZO host after the heat treatment increased the electrical conductivity. The nanocomposite AZO-PMMA films on all substrates (fused silica (FS), $Al_2O_3$ (sapphire), and STO) in the entire temperature range 300 to 600K had higher electrical conductivity than the pure AZO films on the same substrates. The most prominent increase of the electrical conductivity (3.5 times) was for the films on $Al_2O_3$ substrate (from 475 S/cm to 1650 S/cm (siemens per centimeter) at 600K).

In order to achieve carbonization beneficial for the TE effect, the following conditions may be observed: (1) the films may be deposited using the DB-MAPLE process with the polymer kept at a weight proportion to the AZO host between 0.1 to 0.5%; (2) the thickness of the deposited films may be preferably (500±50) nm; (3) the deposited films may be heat treated in vacuum for one or more cycles, preferably ten cycles of ramping the temperature at a predefined heating rate of for example, (5±1) K/min from a low temperature, preferably below 400 degrees Kelvin, for example room temperature (293K) to a predefined high temperature, preferably above 450K, preferably above 500K, for example, 600K, and then cooling for 5 hours down to the low temperature. The indication of stabilization of the carbonized films after heat treatment is the reproducible behavior of the electrical conductivity in response to the temperature ramping. Exemplary results are presented in FIG. 9a.

Measurement of the Thermal Conductivity of the Films

Figure 10:
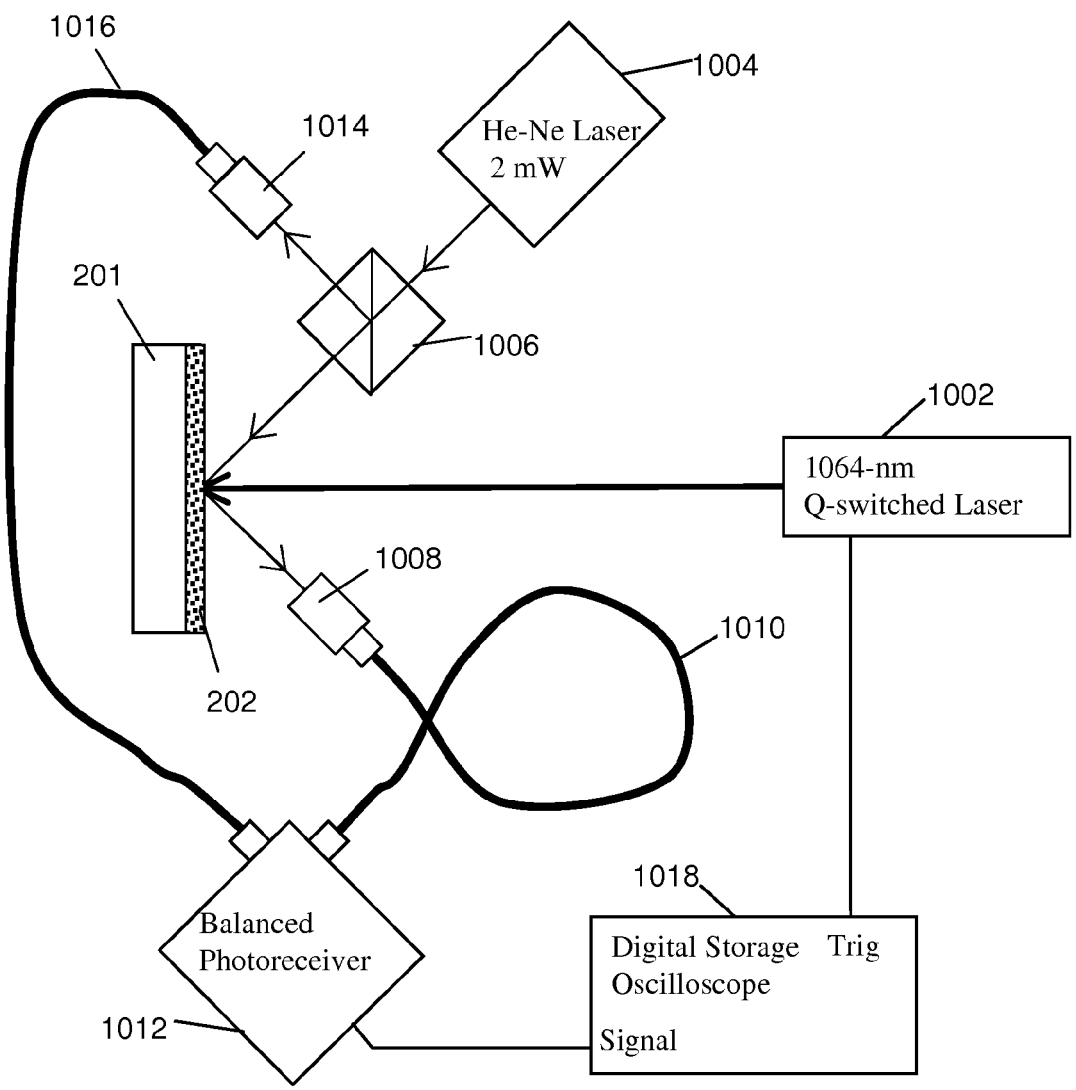
FIG. 10 is a schematic of the experimental setup to measure the thermal conductivity of the deposited nanocomposite films using the time domain thermo-reflectance method.

The thermal conductivity of the films is measured using the time domain (transient) thermo-reflectance method with the system presented in FIG. 10. The method is also called as laser flash method because it uses a pulsed laser for rapid heating.

FIG. 10 is a schematic of the experimental setup to measure the thermal conductivity of the deposited nanocomposite films using the time domain thermo-reflectance method. The principle of measurement is the following. A pulsed 1064-nm laser heats the sample film on a substrate with a single pulse and causes rapid temperature increase in a small size area (<1 mm diameter). A beam from a low power (2 mW) continuous He—Ne laser is incident on the sample in the same spot. The reflected beam is detected by a balanced photo detector. The reflectance of a sample film depends on the temperature. Thus detecting the power of the reflected He—Ne beam makes possible to monitor the kinetics of the temperature relaxation in time (time-domain thermo-reflectance).

Figure 11:
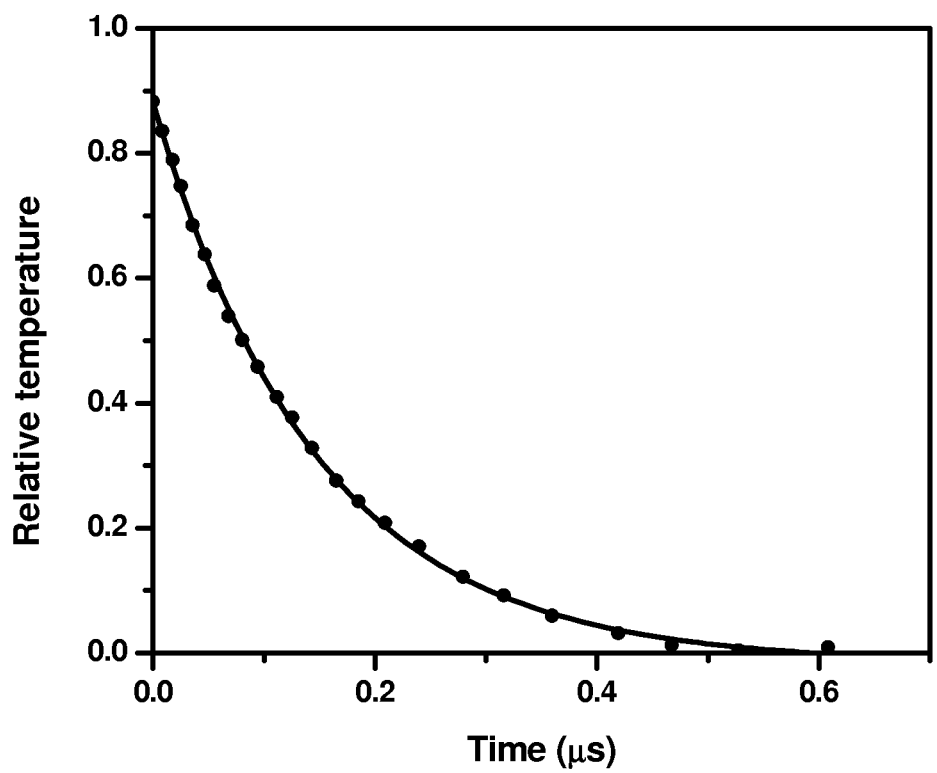
FIG. 11 shows an exemplary series of the typical temperature (proportional to reflectance) plotted versus time curves for a pure AZO film.

FIG. 11 shows an exemplary plot of the typical temperature (proportional to reflectance) plotted versus time for a pure AZO film. The reflectance can be calibrated in terms of true temperature using the reference samples with known thermal conductivity. Fitting experimental data with the exponential function $$T_{rel}(t) = Ae^{-\frac{t}{\tau_T}}, \tag{4}$$

where t is the time passed since the end of the 1064-nm laser pulse heating the film; $T_{rel}(t)=(T(t)-T_o)/T_o$ is the relative temperature of the film (proportional to the reflectance) in the region where the laser pulsed heating occurred; T(t) is the actual temperature; $T_o$ is the initial (room) temperature of the film before heating; A is the amplitude (the first fitting parameter); $\tau_T$ is the temperature relaxation time determined by the formula $$\tau_T = \frac{cd_m}{\lambda \kappa}, \tag{5}$$

where c is the mass heat capacity of the film material (in J/(kg K)); $d_m$ is the mass density of the film material (in $kg/m^3$); λ is the heat exchange constant between the film and the substrate (in $m^{-2}$); κ is the thermal conductivity of the film (in W/(m K)). Based on exponential fitting of the experimental plot in FIG. 11 $\tau_T$=0.15×10$^{-6}$ s. With the known parameters c=506 J/(kg K), $d_m$=5.7×10$^3$ $kg/m^3$, λ=2.8×10$^{12}$ $m^{-2}$ the thermal conductivity of the film was computed using formula $$\kappa = \frac{c\rho}{\lambda \tau_T} \tag{6}$$

to be κ=6.9 W/(m K).

Measurement of the Seebeck Coefficient of the Films

Seebeck coefficient S (which characterizes the strength of the thermoelectric effect) was evaluated with the experimental setup based on the e.m.f. generated by the thin film energy converter presented in FIG. 2. Referring to FIG. 2, the device comprises of substrate 201, TE inorganic-polymer nanocomposite film 202, "hot" and "cold" electric contacts 203 and 204 respectively, heated and cooled by heat fluxes 205 and 206 respectively, and resistive electric load 207. The incoming heat flux 205 heats up hot contact 203. The outgoing heat flux cools contact 204 down. The temperature gradient along the TE layer 202 creates electromotive force (e.m.f.) that drives electric current 208 through the closed external circuit including load 207. The temperature gradient between the contacts is measured with temperature probes (thermocouples) 209 and 210. The e.m.f. is measured with voltmeter 211. The energy of heat was thus harvested and converted into electricity in response to the temperature difference between the "hot" and "cold" contacts. The e.m.f. was measured with a nanovoltmeter (Keithley 2182A). The temperature difference between the contacts was created by a resistive electric heater. A temperature controller equipped with thermocouple temperature sensors connected to the contacts was used to vary the temperature difference within range 300 to 600K.

Once the electrical conductivity, thermal conductivity, and Seebeck coefficient were measured, the figure-of-merit ZT of the tested nanocomposite AZO films was computed using formula:

$$ZT = S^2 \sigma T/\kappa. \qquad (7)$$

The measured performance parameters of the fabricated films (single beam PLD produced pure AZO and DB-MAPLE produced inorganic-organic nanocomposite AZO-PMMA) on different substrates, such as electroconductivity $\sigma$; Seebeck coefficient S; the power factor (thermopower) $S\sigma^2$; thermoconductivity $\kappa$; the absolute temperature difference between contacts T; and the figure of merit ZT, are presented in Table below. Also, the bottom row is filled up with data taken for bulk AZO compound. As can be seen, all the nanocomposite AZO-PMMA films have increased ZT as compared to the pure AZO films due to combination of the increased electrical conductivity (caused by carbonization) and the reduced thermal conductivity (due to phonon scattering). The highest value of ZT was achieved for the film on the $Al_2O_3$ (sapphire) substrate with the highest electrical conductivity. For the best performer, the increase of the figure of merit ZT is almost 3 times against the pure AZO film on the same substrate (from 0.0057 to 0.168).

specified functions and relationships thereof are appropriately performed. Any such alternate boundaries are thus within the scope and spirit of the claimed invention.

While various embodiments of the present invention have been described above, it should be understood that they have been presented by way of example only, and not limitation. Thus, the breadth and scope of the present invention should not be limited by any of the above-described exemplary embodiments, but should be defined only in accordance with the following claims and their equivalents.

What is claimed is:

1. A method for making a thermoelectric energy converter comprising:
   vacuum depositing a thermoelectric film by:
   positioning a substrate in a vacuum deposition chamber;
   creating a first target comprising an inorganic semiconductor material doped with a metal material;
   creating a second target comprising a polymer material;
   positioning said first target to direct a first plume toward said substrate;
   positioning said second target to direct a second plume toward said substrate;
   tilting said second target relative to said first target to direct said second plume to a same area on said target as said first plume;
   providing a vacuum in said vacuum deposition chamber with a desired pressure of a background gas;
   directing a first pulsed laser beam to said first target to produce said first plume of said first target material and deposit said first target material on said substrate;
   concurrently with said first pulsed laser beam, directing a second pulsed laser beam to said second target to produce said second plume of said second target material and deposit said second target material on said substrate;
   said depositing said polymer material in a proportion to said inorganic semiconductor material to form polymer nanoclusters, from 1 to 100 nanometers in diameter or width, within a host deposition of said inorganic semiconductor material;

TABLE 1

Performance parameters of the deposited thermoelectric films

| Sample # | Substrate | $\sigma$(300K/600K) S/cm | | S (300K/600K) $\mu$V/K | | $\sigma S^2$ (300K/600K) mW/(m K$^2$) | | k (300K) W/(m K) | | ZT (300K) | |
|---|---|---|---|---|---|---|---|---|---|---|---|
| | | Pure AZO | AZO-PMMA | Pure AZO | AZO-PMMA | Pure AZO | AZO-PMMA | Pure AZO | AZO-PMMA | Pure AZO | AZO-PMMA |
| 1 | STO | 550/700 | 700/850 | −90/−163 | −87/−168 | 0.45/1.68 | 0.53/2.2 | 6.55 | 4.9 | 0.021 | 0.032 |
| 2 | $Al_2O_3$ | 400/475 | 1350/1650 | −58/−126 | −61/−135 | 0.13/0.7 | 0.49/2.8 | 6.9 | 5.0 | 0.0057 | 0.168 |
| 3 | Fused silica (FS) | 350/450 | 1000/1100 | −120/−200 | −115/220 | 0.52/1.79 | 1.36/5.28 | 4.9 | 4.1 | 0.032 | 0.1 |
| 4 | bulk pure AZO at 300K | 210 | | −130 | | 0.4 | | 34 | | 0.0035 | |

CONCLUSION

The present invention has been described above with the aid of functional building blocks illustrating the performance of specified functions and relationships thereof. The boundaries of these functional building blocks have been arbitrarily defined herein for the convenience of the description. Alternate boundaries can be defined so long as the creating a first contact on said thermoelectric film, said first contact configured for receiving a heat flux and conducting said heat flux to said thermoelectric film; said first contact electrically connected to said thermoelectric film;

creating a second contact on said thermoelectric film, said second contact separated from said first contact, said second contact configured for receiving said heat flux from said thermoelectric film and dissipating said heat flux away from said thermoelectric film, said heat flux producing a thermal gradient in said thermoelectric film between said first contact and said second contact; said second contact electrically connected to said thermoelectric film;

carbonizing said polymer material in said film by heat treating said thermoelectric film by heating said thermoelectric film in a vacuum to a predefined temperature greater than 450 degrees Kelvin, thereby producing carbonization in said thermoelectric film to improve a thermoelectric figure of merit in said thermoelectric film;

applying heat to said first contact and cooling said second contact, thereby generating said heat flux through said thermoelectric film; and forming a closed circuit through said thermoelectric film and a load by connecting said first contact and said second contact to said load; said closed circuit permitting conduction of a current through said thermoelectric film and through said load, said current generated responsive to said thermal gradient in said thermoelectric film, thereby converting thermal energy from said heat flux to electrical energy applied to said load.

2. The method in accordance with claim 1, wherein said second target further comprises a solvent for said polymer material; further comprising: cooling said second target to a solidification temperature.

3. The method in accordance with claim 2, wherein said first laser is a visible laser.

4. The method in accordance with claim 3, wherein said second laser is an infrared laser.

5. The method in accordance with claim 4, wherein said first laser beam is derived from said second laser beam by a nonlinear optical process.

6. The method in accordance with claim 2, wherein said first laser beam has a pulse length less than 20 nanoseconds and a fluence of greater than 100 mJ/cm$^2$.

7. The method in accordance with claim 2, wherein said second laser beam has a pulse length less than 20 nanoseconds and a fluence of greater than 400 mJ/cm$^2$.

8. The method in accordance with claim 1, wherein the substrate is a crystalline substrate.

9. The method in accordance with claim 1, wherein the substrate is an organic polymer substrate.

10. The method in accordance with claim 9, wherein the organic polymer substrate comprises a polyimide material.

11. The method in accordance with claim 1, wherein said inorganic semiconductor material is zinc oxide and said metal material is aluminum.

12. The method in accordance with claim 1, wherein said polymer material comprises PMMA.

13. The method in accordance with claim 1, further including:
cycling said temperature between a low temperature below 400 degrees Kelvin and said predefined temperature for one or more cycles.

14. The method in accordance with claim 13, wherein said cycling said temperature comprises ramping said temperature at a heating rate of 5 plus or minus one Kelvin degrees per minute.

15. The method in accordance with claim 14, wherein said cycling said temperature comprises cooling to said low temperature following said ramping at said heating rate, said cooling being at a rate slow enough to prevent cracking and/or peeling of the deposited film.

16. The method in accordance with claim 1, wherein the polymer material is deposited at a weight proportion compared to the inorganic semiconductor material doped with a metal material of 0.1 to 0.5 percent and the thickness of the deposited film is between 450 and 550 nanometers.

17. The method in accordance with claim 16, wherein the heat treating comprises one or more cycles of ramping the temperature at a predefined heating rate of between four and six Kelvin degrees per minute from a low temperature below 400 degrees Kelvin to a high temperature above 500 degrees Kelvin and then cooling to said low temperature.

18. The method in accordance with claim 17, wherein said low temperature is 293 degrees Kelvin.

* * * * *